(12) United States Patent
Daniels et al.

(10) Patent No.: US 9,666,768 B2
(45) Date of Patent: May 30, 2017

(54) QUANTUM DOT NANOPARTICLES HAVING ENHANCED STABILITY AND LUMINESCENCE EFFICIENCY

(71) Applicant: Nanoco Technologies Ltd., Manchester (GB)

(72) Inventors: Steven Daniels, Derbyshire (GB); Arun Narayanaswamy, Manchester (GB)

(73) Assignee: Nanoco Technologies Ltd., Manchester (GB)

( * ) Notice: Subject to any disclaimer, the term of this patent is extended or adjusted under 35 U.S.C. 154(b) by 223 days.

(21) Appl. No.: 14/615,243

(22) Filed: Feb. 5, 2015

(65) Prior Publication Data

US 2015/0228866 A1    Aug. 13, 2015

Related U.S. Application Data

(60) Provisional application No. 61/937,073, filed on Feb. 7, 2014.

(51) Int. Cl.
| | |
|---|---|
| *C09K 11/02* | (2006.01) |
| *H01L 33/50* | (2010.01) |
| *C09K 11/70* | (2006.01) |
| *B82Y 20/00* | (2011.01) |
| *B82Y 40/00* | (2011.01) |

(52) U.S. Cl.
CPC .......... *H01L 33/502* (2013.01); *C09K 11/025* (2013.01); *C09K 11/703* (2013.01); *B82Y 20/00* (2013.01); *B82Y 40/00* (2013.01); *H01L 2933/0041* (2013.01); *Y10S 977/81* (2013.01); *Y10S 977/88* (2013.01); *Y10S 977/882* (2013.01); *Y10S 977/95* (2013.01)

(58) Field of Classification Search
CPC ....... C09K 11/02; C09K 11/025; H01L 33/50; H01L 33/502; Y10S 977/81; Y10S 977/88; Y10S 977/882; B82Y 40/00
See application file for complete search history.

(56) References Cited

U.S. PATENT DOCUMENTS

| | | | | |
|---|---|---|---|---|
| 7,588,828 B2 * | 9/2009 | Mushtaq | ............... | C01B 25/082 427/212 |
| 7,803,423 B2 * | 9/2010 | O'Brien | ................. | B82Y 30/00 427/212 |
| 7,867,557 B2 * | 1/2011 | Pickett | .................... | B82Y 30/00 427/212 |
| 7,985,446 B2 | 7/2011 | O'Brien et al. | | |
| 8,062,703 B2 | 11/2011 | O'Brien et al. | | |
| 2010/0009071 A1 | 1/2010 | Chopra et al. | | |
| 2010/0059721 A1 | 3/2010 | Pickett et al. | | |

FOREIGN PATENT DOCUMENTS

| | | |
|---|---|---|
| EP | 2599898 A1 | 5/2013 |
| WO | 2013114308 A1 | 8/2013 |

OTHER PUBLICATIONS

Jun Wang et al, "A single biphasic route to water soluble dithiocarbamate functionalized quantum dots", Journal of Materials Chemistry, vol. 18, No. 27, Jul. 21, 2008, pp. 3270-3274.*
Hou et al, "Multiple-structuted nanocrystals toward bifunctional photoluminescent-superhydrophobic surfaces", Journal of Mateial Chemistry, 20, Mar. 15, 2010, pp. 3863-3868.*
Zhang et al, "Dithiocarbamates as Capping Ligands for Water-Soluble Quantum Dots", Applied Materials and Interfaces, vol. 2, No. 11, Nov. 5, 2010, pp. 3384-3395.*
Jiazi Wang et al, "Diethyldithiocarbamate functionalized CsSe/CdS quantum dots as a fluorescent probe for copper ion detection", Spectrochimica Acta Part A, 81, 2011, pp. 178-183.*
Agnieszka Z. Wilczewska et al: "Surface-Initiated RAFT/MADIX Polymerization on Xanthate-Coated Iron Oxide Nanoparticles", Macromolecular Chemistry and Physics, vol. 215 , No. 2, Jan. 1, 2014 (Jan. 1, 2014), pp. 190-197, XP055199334, ISSN: 1022-1352, DOI: 10.1002/macp.201300400 the whole document.
English translation from an Office Action received in corresponding ROC (Taiwan) patent application No. 104104132, issue date Nov. 17, 2015.
Murray, C.B. et al., "Synthesis and Characterization of Nearly Monodisperse CdE (E=S, Se, Te) Semiconductor Nanocrystallites", J. Am. Chem. Soc. (1993) 115 (19) pp. 8706-8715.
Yanji E Zhang et al: "Dithiocarbamates as Capping Ligands for Water-Soluble Quantum Dots", ACS Applied Materials & Interfaces, vol. 2, No. 11, Nov. 24, 2010 (Nov. 24, 2010), pp. 3384-3395, XP055180671, ISSN: 1944-8244, DOI: 10.1021/am100996g the whole document.
Jiazi Wang et al: "Diethyldithiocarbamate functionalized CdSe/CdS quantum dots as a fluorescent probe for copper ion detection", Spectrochimica Acta. Part A: Molecular and Biomolecular Spectroscopy, Elsevier, Amsterdam, NL, vol. 81, No. 1, May 30, 2011 (May 30, 2011), pp. 178-183, XP028291814, ISSN: 1386-1425, DOI: 10.1016/J.SAA.2011.05.098 [retrieved on Jun. 12, 2011] the whole document.
Sashuk, V., (2012), "Thiolate-Protected Nanoparticles via Organic Xanthates: Mechanism and Implications", ACS, Institute of Physical Chemistry, vol. 6, No. 12, pp. 10855-10861.
Wong, W.W.H., et al., (2005), "Ditopic redox-active polyferrocenyl zinc (II) dithiocarbamate macrocyclic receptors: synthesis, coordination and electrochemical recognition properties", Dalton Trans., pp. 774-781.
English translation from an Office Action received in corresponding ROC (Taiwan) patent application No. 140104132, issue date Nov. 7, 2016.
English translation from an Office Action received in corresponding ROC (Taiwan) patent application No. 105116320, issue date Nov. 17, 2016.
Huang, S.,et al., (2012), "The preparation of graphene hybrid films decorated with poly[2-methoxy-5-(2'-ethyl-hexyloxy)-1,4-phenylene vinylene] particles prepared by non-solvent induced precipitation", Carbon 50, pp. 216-224.

* cited by examiner

*Primary Examiner* — Carol M Koslow
(74) *Attorney, Agent, or Firm* — Blank Rome LLP

(57) ABSTRACT

Certain dithio-compounds have been found to be superior capping ligands for quantum dot (QD) nanoparticles. Example dithio-ligands include dithiocarbamate ligands. These strongly binding ligands are capable of coordinating to both positive and negative atoms on the surface of the nanoparticle. The ligands are bi-dentate and thus their approach to the QD surface is not as sterically hindered as is the approach of mono-dentate ligands. These ligands can therefore completely saturate the QD surface.

9 Claims, 1 Drawing Sheet

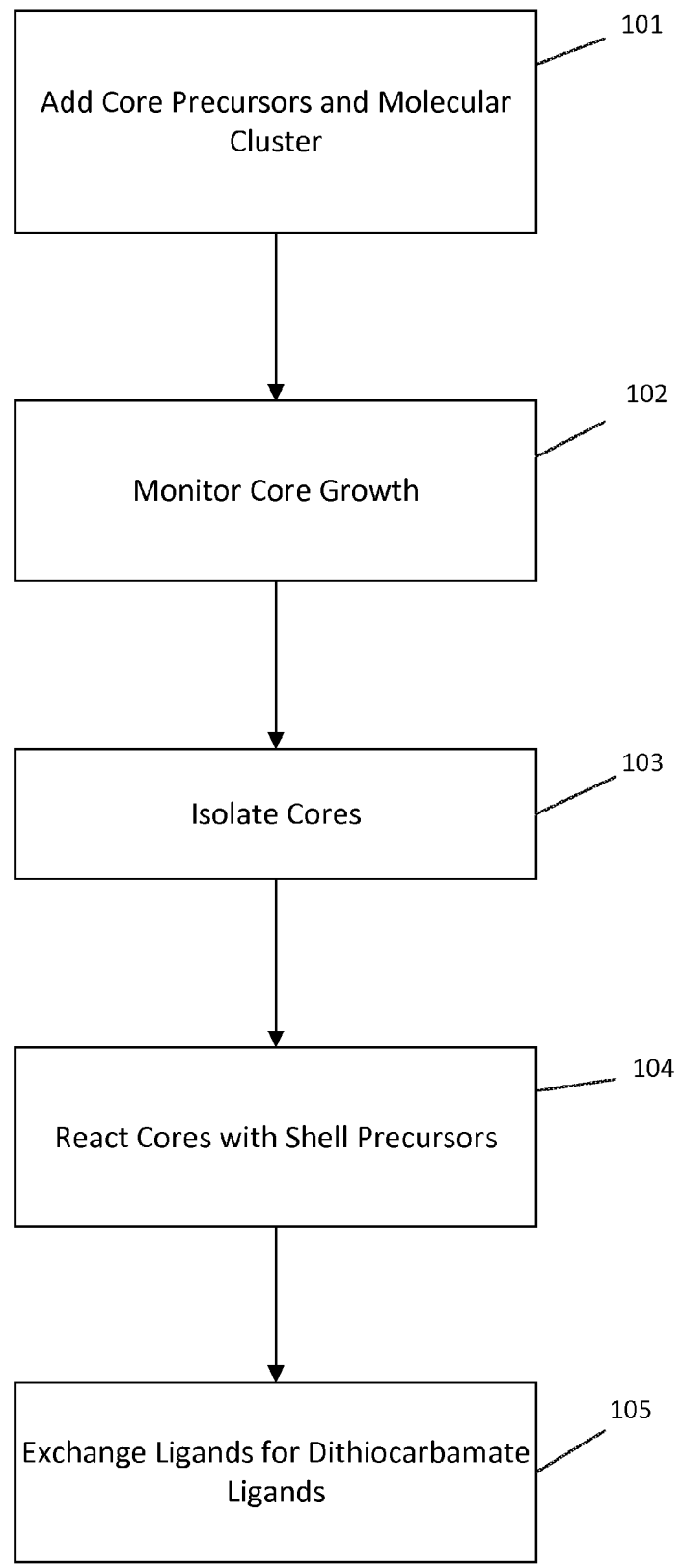

QUANTUM DOT NANOPARTICLES HAVING ENHANCED STABILITY AND LUMINESCENCE EFFICIENCY

CROSS-REFERENCE TO RELATED APPLICATIONS

This application claims the benefit of U.S. Provisional Application No. 61/937,073 filed on Feb. 7, 2014.

STATEMENT REGARDING FEDERALLY SPONSORED RESEARCH OR DEVELOPMENT

Not Applicable

BACKGROUND OF THE INVENTION

1. Field of the Invention

The present invention generally relates to semiconductor nanoparticles ("quantum dots"). More particularly, it relates to semiconductor nanoparticles having capping ligands on their outer surface.

2. Description of the Related Art Including Information Disclosed Under 37 CFR 1.97 and 1.98

There has been substantial interest in the preparation and characterization of compound semiconductor particles with dimensions on the order of 2-100 nm, often referred to as quantum dots (QDs) and/or nanocrystals. This is mainly because of their size-tunable electronic, optical and chemical properties. For example, many QDs display relatively strong emission in the visible region of the electromagnetic spectrum. Moreover, the wavelength of light absorbed and emitted is a function of the size of the QD. Because of their unique optical properties, QDs are promising materials for commercial applications as diverse as biological labeling, solar cells, catalysis, biological imaging, light-emitting diodes amongst many new and emerging applications.

To date, the most studied and prepared of semiconductor materials have been the II-VI materials, namely, ZnS, ZnSe, CdS, CdSe, CdTe—most notably CdSe due to its tuneability over the visible region of the spectrum. As mentioned semiconductor nanoparticles are of academic and commercial interest due to their properties, which are unique from the properties of the corresponding crystalline bulk forms of the same semiconductor materials. Two fundamental factors, both related to the size of the individual nanoparticles, are responsible for their unique properties. The first is the large surface-to-volume ratio. As a particle becomes smaller, the ratio of the number of surface atoms to those in the interior increases. This leads to the surface properties playing an important role in the overall properties of small particles. The second factor is that, with semiconductor nanoparticles, there is a change in the electronic properties of the material with the size of the particle. Specifically, the band gap gradually becomes wider as the size of the particle decreases. This change in band gap is because of quantum confinement effects. This effect is a consequence of the confinement of an "electron in a box," giving rise to discrete energy levels similar to those observed in atoms and molecules, rather than a continuous band as in the corresponding bulk semiconductor material. Thus, for a semiconductor nanoparticle, the "electron and hole" produced by the absorption of a photon are closer together than in the corresponding macrocrystalline material, resulting in non-negligible Coulombic interaction between the electron and hole. This leads to a narrow bandwidth emission that is dependent upon the particle size and composition. Consequently, quantum dots have higher kinetic energy than the corresponding macrocrystalline material and the first excitonic transition (band gap) increases in energy with decreasing particle diameter. Thus, quantum dots with a smaller diameter absorb and emit light of higher energy than do quantum dots with a larger diameter. In other words, the color of light absorbed and emitted can be "tuned" as a function of the particle diameter.

Single core nanoparticles, which consist of a single semiconductor material, tend to have relatively low quantum efficiencies due to electron-hole recombination occurring at defects and dangling bonds situated on the nanoparticle surface that lead to non-radiative electron-hole recombinations. One method to eliminate defects and dangling bonds is to grow a shell of a second semiconductor material having a wider band-gap on the surface of the core particle to produce a "core-shell particle". The shell semiconductor material preferably has a small lattice mismatch with the core material so that the interface between the two materials is minimized. Core-shell particles separate charge carriers confined in the core from surface states that would otherwise act as non-radiative recombination centers. A common example is ZnS grown on the surface of CdSe cores. Excessive strain can further result in defects and non-radiative electron-hole recombination resulting in low quantum efficiencies.

Several synthetic methods for the preparation of semiconductor nanoparticles have been reported. Early routes applied conventional colloidal aqueous chemistry, while more recent methods involve the kinetically controlled precipitation of nanocrystallites, using organometallic compounds.

Since the optical properties of QDs are size-dependent, it is often desirable to produce populations of QDs with a high degree of monodispersity, i.e., with a high degree of uniformity in the size of the QDs in the population. Also, populations of QDs with a high quantum yield (QY, the ratio of photons emitted to photons absorbed) are desirable. Methods have been reported to produce semiconductor QDs with high monodispersity and with quantum yields greater than 50%. Most of these methods are based on the original "nucleation and growth" method described by Murray, Norris and Bawendi, M. G. *J. Am. Chem. Soc.* 1993, 115, 8706. Murray et al. originally used organometallic solutions of metal-alkyls ($R_2M$) M=Cd, Zn, Te; R=Me, Et and tri-n-octylphosphine sulfide/selenide (TOPS/Se) dissolved in tri-n-octylphosphine (TOP). These precursor solutions are injected into hot tri-n-octylphosphine oxide (TOPO) in the temperature range 120-400° C. This produces TOPO coated/capped semiconductor nanoparticles of II-VI material. The size of the particles can be controlled by the temperature, concentration of precursor used, and length of time of the synthesis. This organometallic route has advantages over other synthetic methods, including near monodispersity and high particle cystallinity.

Cadmium and other restricted heavy metals used in conventional QDs are highly toxic and represent a major concern in commercial applications. The inherent toxicity of cadmium-containing QDs prevents their use in any applications involving animals or humans. For example recent studies suggest that QDs made of a cadmium chalcogenide semiconductor material can be cytotoxic in a biological environment unless protected. Specifically, oxidation or chemical attack through a variety of pathways can lead to the formation of cadmium ions on the QD surface that can be released into the surrounding environment. Although surface coatings such as ZnS can significantly reduce the toxicity, it may not completely eliminate it because QDs can be retained in cells or accumulated in the body over a long period of time, during which their coatings may undergo some sort of degradation exposing the cadmium-rich core.

The toxicity also affects applications including optoelectronic and communication because heavy metal-based materials are widespread in many commercial products including household appliances such as IT and telecommunication equipment, lighting equipment, electrical and electronic tools, toys, leisure and sports equipment. Legislation to restrict or ban certain heavy metals in commercial products has been already implemented in many regions of the world. For example, the European Union directive 2002/95/EC, known as the "Restrictions on the use of Hazardous Substances in electronic equipment" (or RoHS), bans the sale of new electrical and electronic equipment containing more than certain levels of lead, cadmium, mercury, hexavalent chromium along with polybrominated biphenyl (PBB) and polybrominated diphenyl ether (PBDE) flame retardants. As a result of this mandate, manufacturers have had to find alternative materials and develop new engineering processes for the creation of common electronic equipment. In addition, on 1 Jun. 2007, a European Community Regulation came into force concerning chemicals and their safe use (EC 1907/2006). The Regulation deals with the Registration, Evaluation, Authorization and Restriction of Chemical substances and is known as "REACH". The REACH Regulation imposes greater responsibility on industry to manage the risks from chemicals and to provide safety information on the substances. It is anticipated that similar regulations will be extended worldwide. Thus, there is significant economic incentive to develop alternatives to II-VI QD materials.

Due to their increased covalent nature, III-V and IV-VI highly crystalline semiconductor nanoparticles are more difficult to prepare and much longer annealing times are usually required. However, there are now reports of III-VI and IV-VI materials being prepared in a similar manner to that used for the II-VI materials. Examples of such III-VI and IV-VI materials include GaN, GaP, GaAs, InP, InAs and for PbS and PbSe.

For all of the above methods, rapid particle nucleation followed by slow particle growth is essential for a narrow particle size distribution. All these synthetic methods are based on the original organometallic "nucleation and growth" method by Murray et al., which involves the rapid injection of the precursors into a hot solution of a Lewis base coordinating solvent (capping agent). The addition of the cooler solution lowers the reaction temperature and assists particle growth but inhibits further nucleation. The temperature is then maintained for a period of time, with the size of the resulting particles depending on reaction time, temperature, and ratio of capping agent to precursor used. The resulting solution is cooled followed by the addition of an excess of a polar solvent (methanol or ethanol or sometimes acetone) to produce a precipitate of the particles that can be isolated by filtration or centrifugation. Generally, larger particles precipitate easier than smaller particles. Thus, precipitation provides a means of separating the quantum dots as a function of their size. Multiple precipitation steps are required to achieve narrow particle size distributions.

Fundamentally, these prior art preparations rely on the principle of particle nucleation followed by growth. That principle relies on separation of the nanoparticle nucleation step (at a high temperature) from the nanoparticle growth step (at a lower temperature) to obtain monodispersity. Such separation of steps is achieved by rapid injection of one or both precursors into a hot coordinating solvent (containing the other precursor if not otherwise present), which initiates particle nucleation. The sudden addition of the cooler solution upon injection subsequently lowers the reaction temperature (the volume of solution added is about ⅓ of the total solution) and inhibits further nucleation maintaining a narrow nanoparticle size distribution. This method may work well for small-scale synthesis where one solution can be added rapidly to another while keeping a homogenous temperature throughout the reaction. However, on a larger preparative scale, whereby large volumes of solution are required to be rapidly injected into one another, temperature differentials can occur within the reaction, which can lead to a large particle size distribution. Moreover, the need to perform multiple size-selective purification steps is not practical for the production of large quantities of QDs.

U.S. Pat. Nos. 7,588,828, 7,803,423, 7,985,446, and 8,062,703 (collectively referred to herein as "the seeding patents"), the entire contents of which are hereby incorporated by reference, describe synthetic methods for preparing monodisperse QD populations that do not rely on the hot injection methods and the size-selective purification steps described above. Briefly, the methods involve the use of a molecular cluster "seed" compound that serves as a template for the nucleation of the QD semiconductor material in solution. The cluster compound acts as a seed or nucleation point upon which nanoparticle growth can be initiated. In this way, a high temperature nucleation step is not necessary to initiate nanoparticle growth because suitable nucleation sites are already provided in the system by the molecular clusters. By providing nucleation sites that are more uniform than the nucleation sites employed in the methods described above, the synthesis provides a population of QDs that are essentially monodisperse. A significant advantage of the molecular seeding method is that it can be easily scaled-up.

Regardless of how the QD nanoparticles are prepared, the bonding of the atoms about the outer inorganic surface atoms is incomplete. The surface is populated with highly reactive "dangling bonds", which can lead to particle agglomeration. These uncoordinated surface atoms may also provide excitons with surface states that can give alternative recombination pathways to radiative emission. Such pathways are undesirable and lead to lower luminescence. Additionally, uncoordinated atoms can be more susceptible to oxidation.

The problems associated with uncoordinated dangling bonds can be partially overcome by passivating (capping) the "bare" surface atoms with protecting organic groups. The capping or passivating of particles not only prevents particle agglomeration from occurring, it also protects the particle from its surrounding chemical environment and provides electronic stabilization (passivation) to the particles. The capping agent is typically a Lewis base compound or other electron-donating compound that binds to surface metal atoms of the outermost inorganic layer of the particle (for example, bound to the outermost shell of a core-shell QD particle). When the QD shell synthesis is performed in an electron-donating solvent, such as TOP/TOPO, the capping agent may simply be solvent molecules adhered to the surface of the QD. In the case that a non-electron-donating solvent is used, electron-rich capping agent may be added to the shell synthesis. For example, if a solvent such as THERMINOL is used for the shelling reaction, it may be necessary to add an electron-donating compound, such as myristic acid to the reaction mixture to provide a capping ligand.

While electron-donating capping ligands provide some stability and surface passivation, many of these ligands only weakly adhere to the surface of QD nanoparticles. Desorption of the capping ligands leave vacancies on the surface that can lead to agglomeration, precipitation, and that are detrimental to the quantum efficiency of the QDs. One way of addressing the problem of weakly bound capping ligands has been to use capping ligands that contain functional groups that have a specific binding affinity for atoms on the surface of the QDs. For example, the sulfur of thiol compounds has an affinity for many of the metal atoms, such as zinc, that are commonly components of QD shell semiconductor materials, such as ZnS and ZnSe. Thus, thiols have been widely used as capping ligands for QDs. But thiol capping ligands can also desorb, leaving problematic vacancies on the QD surface. One probable mechanism for thiol ligand desorption is via the formation of disulfide bonds between neighboring thiols on the QD surface, followed by desorption of the disulfide. Another problem with thiol capping ligands is that, in some cases, steric hindrances may prevent complete surface coverage. In other words, once a certain surface coverage is obtained, additional thiol molecules are sterically prevented from reaching the surface of the QD to bond even though there are still a significant number of dangling bonds at the surface left unfilled. There is thus a need for more affective capping ligands for QDs in order to maximize the performance and stability of QD materials.

BRIEF SUMMARY OF THE INVENTION

The dithio-ligands disclosed herein address the problems described above. Example dithio-ligands include dithiocarbamate ligands. The strongly binding ligands described herein are capable of coordinating to both positive and negative atoms on the nanoparticle's surface. The ligands are bi-dentate and thus their approach to the QD surface is not as sterically hindered as is the approach of mono-dentate ligands. The disclosed ligands can therefore completely saturate the QD surface.

According to one embodiment, a first ligand having a group that binds the electropositive atoms of the QD surface is added to the QD and then a second ligand having a group that binds the electronegative atoms is added. For example, if the outermost shell comprises ZnS, one ligand may preferentially bind to Zn atoms, which are electropositive on the shell surface and a second ligand may preferentially bind to S atoms, which are more electronegative. By binding a greater number of the available binding sites on the QD surface, the dithiocarbamate ligands disclosed herein enhance the stability and optical characteristics of QD nanoparticles.

BRIEF DESCRIPTION OF THE SEVERAL VIEWS OF THE DRAWING(S)

FIG. 1 is a flow diagram of a process according to the invention for preparing QDs with dithiocarbamate ligands.

DETAILED DESCRIPTION OF THE INVENTION

The dithiocarbamate ligands described herein can be used as capping ligands for generally any type of semiconductor QD nanoparticle. Particularly useful QD nanoparticles are prepared as described in U.S. Pat. Nos. 7,588,828, 7,803,423, 7,985,446, and 8,062,703 (referred to herein collectively as "the seeding patents"), the entire contents of which are hereby incorporated by reference. FIG. 1 illustrates such a method of preparing QD nanoparticles. Briefly, the method involves reacting core material precursors in the presence of a molecular cluster compound, which acts as a seed for crystal growth (101). The seeding patents describe a number of precursor materials and molecular cluster compounds. As an example, suitable precursor compounds for an InP-based core must provide a source of indium and a source of phosphorus. For example, the indium source may be indium myristate and the phosphorus source may be tris(trimethylsilyl)phosphine. It will be appreciated that other indium and phosphorus sources may be used.

The core-forming reaction may be conducted in the presence of a molecular seeding compound. Suitable molecular seeding compounds are described at length in the seeding patents referenced above. One example of a suitable molecular seeding compound is the zinc sulfide-based molecular seeding compound described in U.S. Pat. No. 8,062,703. The core precursor compounds and the molecular seeding compound are heated in a solvent under conditions described in the seeding patents and U.S. Patent Publication No. 2010/0068522, the entire contents of which are hereby incorporated by reference. Generally, a non-electron donating solvent is used for the reaction. One example of an appropriate solvent is a heat transfer fluid such as THERMINOL® (SOLUTIA INC., ST. LOUIS MISSOURI 63141).

It may be desirable to monitor core growth 102 (e.g., via an optical property of the QD core) during the synthesis of the core. For example, the absorbance spectrum may be monitored as the QD core grows and the reaction may be stopped when the core reaches the proper size to yield the desired absorbance and/or emission spectrum. Once the desirable optical value is obtained and the reaction stopped, the cores can be isolated 103, for example, by filtration. It may be desirable to add a non-solvent to the reaction mixture to induce precipitation of the cores. Once the cores are isolated, they may be reacted with shell precursors 104 to grow one or more semiconductor shells on the cores. It may be desirable to pretreat the cores, for example, by etching a small amount of the material from the core, prior to reacting the core with the shell precursors. An acid, such as hydrofluoric acid may be used to etch the core.

The shell precursors react to form a shell of semiconductor material on the QD cores. If a non-coordinating solvent is used during the shelling reaction it may be necessary to add a coordinating ligand such as myristic acid during the shelling reaction to stabilize the shelling reaction. If a coordinating solvent such as TOP/TOPO is used, then solvent molecules themselves may act as ligands to stabilize the shelling reaction. In either case, the outermost semiconductor surface of the QDs is bound to capping ligands.

The next step 105 is to exchange at least a portion of the capping ligands with the disclosed ditho-ligands. The dithio ligands have the general structure (1):

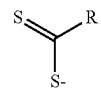

Examples of dithio-ligands include dithiocarbamate ligands. Examples of suitable first dithiocarbamate capping ligands are represented by structures (2) and (3):

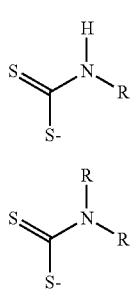

(2)

(3)

Other suitable dithio-ligands include alkyldithiocarbonate (i.e., xanthate) ligands, having the general structure (4):

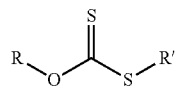

The R groups (that is, R and R') may be any functional groups, and are generally hydrocarbons. Examples include alkyl or aryl groups. One example is ethyl groups. According to some embodiments, the R groups may contain functional groups with the ability to tailor the hydrophilicity of the QDs, for example to render the QDs more soluble in hydrophilic environments. An example of such an R group is a C12 hydrocarbon chain with a carboxylic acid functionality on the C12 position. Once suitably coordinated to the surface of the dots, the carboxylic acid can be deprotonated with a base and the dots transferred to hydrophilic media. Alternatively, the R groups may be an amphiphilic group such as a PEG (polyethyleneglycol).

A first dithio-capping ligand may be exchanged to bind to the electropositive atoms on the surface. For example, the first dithio-capping ligand may bind to zinc on the surface of a ZnS or ZnSe surface. The first dithio-capping ligand compounds (1)-(4) may be provided as a salt of sodium or potassium. The dithio-ligands may be provided as a powder or in a solvent such as THERMINOL.

Another example of a suitable dithio-ligand is represented by structure (5):

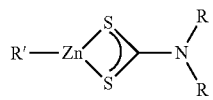

In structure (5), R is as defined above and R' is typically an alkyl group. Compounds of structure (5) may exist in both monomeric and dimeric forms. When R' is an ethyl group, the monomeric form is a major species. Compounds according to structure (5) have great potential for coordinating to surface sulfide and/or selenium ions, thereby satisfying the preferred coordination of the metal (Zn) atom.

Zinc dithiocarbamates, such as illustrated in structure (5) above, have been used as single source precursors for ZnS nanoparticles. Those compounds are viable candidates for single source precursors for depositing ZnS shells upon InP core nanoparticles. However, zinc dithiocarbamates require high temperatures to make them decompose. Such high temperatures negatively impact the performance of the InP core nanoparticle. The decomposition temperature is significantly lower if the zinc dithiocarbamates are provided in the presence of amines. However, addition of amines to InP nanoparticles has a particularly drastic quenching effect on radiative efficiency.

The Applicants have discovered that zinc dithio compounds, such as zinc complexes of structures (2), (3), and (4), and structure (5) may be used as single-source shelling precursors (i.e., single source precursors providing elements of a ZnS shell upon a core nanocrystal) if the zinc dithiocarbamates are "pre-coordinated" to an amine. Another suitable shelling precursor is amine-coordinated zinc alkylthiophosphate, i.e., amine-coordinated compounds of dithio-ligands having the following structure (6):

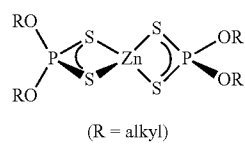

(R = alkyl)

Pre-coordinating an amine with the zinc dithiocarbamate allows the amine and the zinc dithiocarbamate to be introduced into the solution of nanoparticle cores during shelling at a 1:1 ratio of amine to zinc dithiocarbamate. Thus, no free amine is available to participate in quenching reactions with the core surface. The decomposition temperature of the zinc dithiocarbamate is suitably lowered by the amine, but without the adverse quenching effects observed when free amine is present. Examples of suitable amines include amines having long hydrocarbon constituents. A particularly suitable amine is oleylamine.

EXAMPLES

Example 1

The quenching effect of free amine was demonstrated by shelling InP alloy-based cores in the presence and in the absence of oleylamine. InPZnS alloy-based cores were prepared essentially as described in U.S. Pat. No. 7,558,828. Two samples of InP alloy-based cores were each suspended in THERMINOL. Zinc acetate (0.862 g) was added to each mixture and the mixtures were heated to 230° C. for 2 hours. Dodecanethiol (1.69 mL) was added to both mixtures and oleylamine (0.2 mL) was added to one of the mixtures. Both mixtures were allowed to react for a further 1½ hours.

The quantum dots shelled in the absence of oleylamine exhibited photoluminescence at 644 nm having a full width at half maximum (FWHM) of 94 nm and a quantum yield (QY) of 75%. The quantum dots shelled in the presence of oleylamine exhibited photoluminescence at 644 nm having a FWHM of 90 nm and a quantum yield (QY) of 62%. The lower QY of the sample shelled in the presence of amine illustrates the quenching effect of the amine.

Example 2

InPZnS alloy-based cores were prepared as generally described in U.S. Pat. No. 7,588,828. The cores were suspended in THERMINOL (40 mL), to which was also added zinc acetate (5.76 g), myristic acid (1.5 g), zinc stearate (11.32 g). The mixture was heated at 180° C. and then zinc diethyldithiocarbamate (2.295 g) was added and left for 20 minutes. High turbidity was observed and the photoluminescence of the reaction mixture remained very low, suggesting low reactivity/solubility at that temperature. The mixture was heated to 230° C. and left for 3 hrs and gradually the powder dissolved but the QY remains very low throughout.

Example 3

InPZnS alloy-based cores were shelled under the same conditions described in Example 2, except that oleylamine (5 mL) was added to the mixture following the addition of diethyldithiocarbamate at 180° C. The mixture was heated for an additional 20 minutes at 180° C., yielding quantum dots having a photoluminescence peak at 523 nm with a FWHM of 53 nm and a QY of 73%. The difference between Examples 2 and 3 suggest that amine is critical to shelling.

Example 4

InPZnS alloy-based cores prepared as generally described in U.S. Pat. No. 7,588,828 were shelled as described in Example 3, except that the zinc diethyldithiocarbamate was first complexed with oleylamine by premixing the two together under nitrogen using a water bath set to 50° C. prior to adding to the shelling reaction. The shelling reaction yielded quantum dots having luminescence QY of 75%. Similar reactions yielded quantum dots having luminescence QY as high as 85%.

Example 5

InPZnS alloy-based cores prepared as generally described in U.S. Pat. No. 7,588,828 were shelled as described in Example 4, except that zinc ethlyxanthate was used in the place of zinc diethyldithiocarbamate. InPZnS alloy-based cores (500 mg) myristic acid (1.5 g), zinc acetate (2.4 g), and zinc stearate (5.3 g) were stirred under vacuum in THERMINOL at 100° C. for 1 hour and then heated to 215° C. before cooling to 140° C. A premixed solution of zinc ethylxanthate (0.97 g) and oleylamine 1.05 (mL) in THERMINOL (5 mL) was added to the core solution. The solution was stirred for 1 hr then at 180° C. for one hour. Octanol (2.4 mL) was added and the solution was stirred an additional 30 minutes. The reaction yielded quantum dots having luminescence QY of 85%.

Although particular embodiments of the present invention have been shown and described, they are not intended to limit what this patent covers. One skilled in the art will understand that various changes and modifications may be made without departing from the scope of the present invention as literally and equivalently covered by the following claims.

What is claimed is:
1. A quantum dot (QD) nanoparticle comprising:
a plurality of first dithiocarbamate capping ligands having a formula selected from the group consisting of

wherein each $R^1$ is a functional group; and
a plurality of second dithiocarbamate capping ligands having the formula

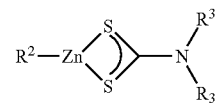

wherein $R^2$ is an alkyl group and $R^3$ is a functional group.
2. The QD nanoparticle recited in claim 1, wherein $R^1$ comprises a hydrophilic group.
3. The QD nanoparticle recited in claim 1, wherein $R^1$ comprises an amphiphilic moiety.
4. The QD nanoparticle recited in claim 1,
wherein each $R^3$ is selected from the group consisting of functional groups comprising a hydrophilic group and functional groups comprising an amphiphilic moiety.
5. The QD nanoparticle recited in claim 1, wherein $R^2$ is an ethyl group.
6. A quantum dot (QD) nanoparticle comprising a plurality of first dithiocarbonate capping ligands having the general structure

wherein at least one of R and R' is a C12 hydrocarbon chain with a carboxylic acid functionality on the C12 position.
7. The QD nanoparticle recited in claim 6 wherein one of R and R' is an alkyl or aryl hydrocarbon.
8. The QD nanoparticle recited in claim 6 wherein one of R and R' is an amphiphilic group.
9. The QD nanoparticle recited in claim 8, wherein the amphiphilic group is a polyethyleneglycol (PEG).

* * * * *